(12) United States Patent
Grill et al.

(10) Patent No.: US 9,231,063 B2
(45) Date of Patent: Jan. 5, 2016

(54) BORON RICH NITRIDE CAP FOR TOTAL IONIZING DOSE MITIGATION IN SOI DEVICES

(71) Applicant: International Business Machines Corporation, Armonk, NY (US)

(72) Inventors: Alfred Grill, White Plains, NY (US); Deborah A. Neumayer, Danbury, CT (US); Kenneth P. Rodbell, Sandy Hook, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/187,742

(22) Filed: Feb. 24, 2014

(65) Prior Publication Data

US 2015/0243740 A1    Aug. 27, 2015

(51) Int. Cl.
| | |
|---|---|
| H01L 21/70 | (2006.01) |
| H01L 29/36 | (2006.01) |
| H01L 27/12 | (2006.01) |

(52) U.S. Cl.
CPC ............ *H01L 29/36* (2013.01); *H01L 27/1203* (2013.01)

(58) Field of Classification Search
CPC ........................................................ H01L 29/36
USPC ............................................................. 257/506
See application file for complete search history.

(56) References Cited

U.S. PATENT DOCUMENTS

| | | | |
|---|---|---|---|
| 4,171,489 | A | 10/1979 | Adams et al. |
| 5,142,350 | A | 8/1992 | Heremans et al. |
| 5,162,882 | A | 11/1992 | Pollack |
| 5,275,973 | A | 1/1994 | Gelatos |
| 5,384,285 | A | 1/1995 | Sitaram et al. |
| 5,670,252 | A | 9/1997 | Makowiecki et al. |
| 5,855,693 | A | 1/1999 | Murari et al. |
| 6,124,179 | A | 9/2000 | Adamic, Jr. |
| 6,165,891 | A | 12/2000 | Chooi et al. |
| 6,410,938 | B1 | 6/2002 | Xiang |
| 6,511,908 | B2 | 1/2003 | Kinoshita et al. |
| 6,541,861 | B2 | 4/2003 | Higashi et al. |

(Continued)

FOREIGN PATENT DOCUMENTS

| | | |
|---|---|---|
| CN | 101587902 | 11/2009 |
| EP | 1167291 A1 | 1/2002 |

(Continued)

OTHER PUBLICATIONS

Jackson, K.A., et al., "Handbook of Semiconductor Technology", Jun. 28, 2000, Wiley-VCH Verlag GmbH, vol. 2, pp. 515-517.

(Continued)

*Primary Examiner* — Long K Tran
(74) *Attorney, Agent, or Firm* — Scully, Scott, Murphy & Presser P.C.; Louis J. Percello, Esq.

(57) ABSTRACT

A semiconductor-on-insulator (SOI) structure that includes a cap layer composed of a boron-rich compound or doped boron nitride located between a top semiconductor layer and a buried insulator layer is provided. The cap layer forms a conductive path between the top semiconductor layer and the buried insulator layer in the SOI structure to dissipate total ionizing dose (TID) accumulated charges, thus advantageously mitigating TID effects in fully depleted SOI transistors.

12 Claims, 2 Drawing Sheets

(56) References Cited

U.S. PATENT DOCUMENTS

| | | |
|---|---|---|
| 6,690,091 B1 | 2/2004 | Chooi et al. |
| 6,693,298 B2 | 2/2004 | Eisenbeiser et al. |
| 6,740,977 B2 | 5/2004 | Ahn et al. |
| 6,911,375 B2 | 6/2005 | Guarini et al. |
| 7,029,980 B2 | 4/2006 | Liu et al. |
| 7,202,123 B1 | 4/2007 | Pan |
| 7,300,853 B2 | 11/2007 | Joly et al. |
| 7,358,571 B2 | 4/2008 | Ko et al. |
| 7,535,100 B2 | 5/2009 | Kub et al. |
| 7,615,850 B2 | 11/2009 | Choudhary et al. |
| 8,030,145 B2 * | 10/2011 | Chang et al. .............. 438/157 |
| 8,673,701 B2 * | 3/2014 | Zhu et al. .................. 438/157 |
| 2002/0000556 A1 | 1/2002 | Sakamoto et al. |
| 2002/0063338 A1 | 5/2002 | Mikami et al. |
| 2004/0126993 A1 | 7/2004 | Chan et al. |
| 2004/0137698 A1 | 7/2004 | Taraschi et al. |
| 2005/0156248 A1 | 7/2005 | Chen et al. |
| 2008/0261055 A1 | 10/2008 | Chu et al. |
| 2010/0176482 A1 * | 7/2010 | Dennard et al. ............. 257/506 |
| 2011/0045282 A1 | 2/2011 | Kelber |
| 2011/0151644 A1 | 6/2011 | Vaufredaz |
| 2011/0156107 A1 | 6/2011 | Bohr et al. |
| 2011/0171792 A1 * | 7/2011 | Chang et al. .............. 438/157 |
| 2011/0244694 A1 | 10/2011 | Antonelli et al. |
| 2011/0256386 A1 | 10/2011 | Shi et al. |
| 2012/0326155 A1 * | 12/2012 | Zhu et al. .................... 257/66 |
| 2013/0193445 A1 | 8/2013 | Dennard et al. |

FOREIGN PATENT DOCUMENTS

| | | |
|---|---|---|
| EP | 2 290 123 A1 | 3/2011 |
| JP | 3034310 | 2/1991 |

OTHER PUBLICATIONS

Kho et al., "Boron-rich boron nitride (BN) films prepared by a single spin-coating process of a polymeric precursor", Thin Solid Films, Jun. 2001, 78-83, 389, vol. 289, Issues 1-2, Elsevier Science B.V.

Chan et al., "Dual ion beam deposited boron-rich nitride films," J. Vac. Sci. Technol. A., Sep./Oct. 1999, 2944-2949, vol. 17, Issue 5.

* cited by examiner

BORON RICH NITRIDE CAP FOR TOTAL IONIZING DOSE MITIGATION IN SOI DEVICES

BACKGROUND

The present disclosure relates to semiconductor-on-insulator (SOI) structures, and particularly to SOI structures in which a cap layer comprising a boron-rich compound or doped boron nitride is located between a top semiconductor layer and a buried insulator layer.

Semiconductor-on-insulator (SOI) complementary metal oxide semiconductor (CMOS) technology is currently being considered for a variety of aerospace/military electronic applications. In space systems, exposure to high fluxes of electrons and protons can significantly reduce system lifetime due to total ionizing dose (TID) effects. Ionizing radiation can induce significant charge buildup in oxides and insulators leading to device degradation (e.g., threshold voltage shifts) and failure. This radiation effect has become one of the most important issues affecting the reliability of integrated circuits (ICs) in near earth orbits.

In SOI ICs, a thin semiconductor layer such as, for example, silicon is formed over an insulator layer, such as silicon oxide, which in turn is formed over a substrate. This insulator layer is often referred to as a buried oxide (BOX) layer or simply as a BOX. Total dose response of SOI circuits can be very complicated due to the presence of the buried oxide in an SOI substrate. Total dose radiation-induced back-channel leakage can occur as positive charge trapped in the buried oxide of SOI ICs near the silicon/oxide interface and can cause large increases in IC static power supply leakage current. For a fully-depleted SOI transistor, such as a FinFET and a trigate device, where a top-gate transistor is electrically coupled to a back-gate transistor, radiation-induced charge buildup in the buried oxide will directly affect the top-gate transistor characteristics. In view of the above, there remains a need for providing improved SOI structures and methods to mitigate TID effects.

SUMMARY

The present disclosure provides an SOI structure including a cap layer composed of a boron-rich compound or doped boron nitride located between a top semiconductor layer and a buried insulator layer. The cap layer functions as an electrically leaky layer which forms a conductive path between the top semiconductor layer and the buried insulator layer in the SOI structure to dissipate TID accumulated charges, thus advantageously mitigating TID effects in fully depleted SOI transistors.

In one aspect of the present disclosure, an SOI structure is provided. The SOI structure of the present disclosure includes a handle substrate composed of a first semiconductor material. An insulator layer is located atop an uppermost surface of the handle substrate. A cap layer composed of a boron-rich compound or doped boron nitride is located atop the insulator layer. An SOI layer composed of a second semiconductor material is located atop the cap layer.

In another aspect of the present disclosure, an SOI structure including at least one SOI mesa is provided. The SOI structure includes a handle substrate composed of a first semiconductor material. An insulator layer is located atop an uppermost surface of the handle substrate. A cap layer composed of a boron-rich compound or doped boron nitride is located atop the insulator layer. The at least one SOI mesa is composed of a second semiconductor material and is located atop the cap layer. The at least one SOI mesa has vertical sidewall edges that do not extend beyond, and are not vertically aligned to, vertical sidewall edges of the cap layer.

DETAILED DESCRIPTION

Figure 1:
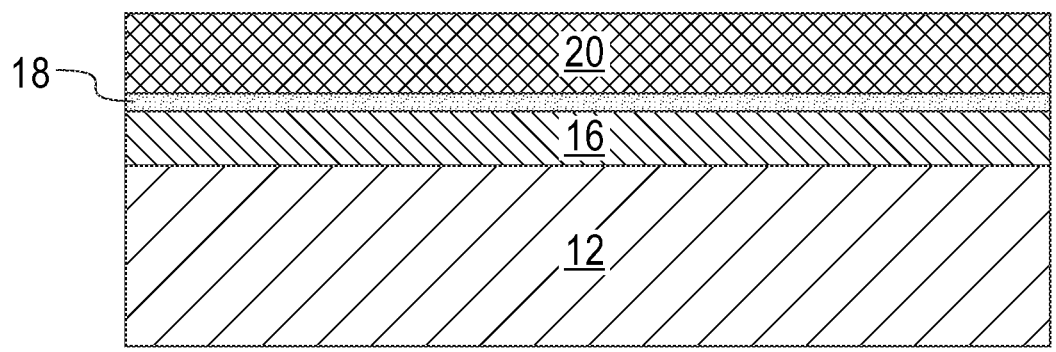
FIG. 1 is a pictorial representation (through a cross-sectional view) depicting an SOI structure in accordance with an embodiment of the present disclosure.

The present disclosure will now be described in greater detail by referring to the following discussion and drawings that accompany the present disclosure. It is noted that the drawings of the present disclosure are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present.

As stated above, the present disclosure provides an SOI structure that includes a cap layer composed of a boron-rich compound or doped boron nitride located between a top semiconductor layer and a buried insulator layer. As such, the SOI structure of the present disclosure advantageously mitigates TID effects in fully depleted devices by forming a conductive path between the top semiconductor layer and the buried insulator layer to dissipate TID accumulated charges.

Referring to FIG. 1, there is illustrated an exemplary SOI structure including, from bottom to top, a handle substrate 12, an insulator layer 16, a cap layer 18, and a semiconductor on insulator (SOI) layer 20 that can be employed in accordance with an embodiment of the present disclosure.

In the embodiment illustrated in FIG. 1, the insulator layer 16 is present on an uppermost surface of the handle substrate 12. The cap layer 18 is present on an uppermost surface of the insulator layer 16. The SOI layer 20 is present on an uppermost surface of the cap layer of 18. The handle substrate 12 provides mechanical support to the insulator layer 16, the cap layer 18 and the SOI layer 20.

The handle substrate 12 that is employed in the present disclosure includes a first semiconductor material which can be selected from, but is not limited to, silicon, germanium, silicon-germanium alloy, silicon carbon alloy, silicon-germanium-carbon alloy, III-V compound semiconductor materials such as, for example, gallium arsenide, indium arsenide and indium phosphide, II-VI compound semiconductor materials, organic semiconductor materials, and other compound semiconductor materials.

All or portions of the handle substrate 12 can be doped to provide at least one globally or locally conductive region (not shown) located beneath the interface between the handle substrate 12 and an optional layer of insulating oxide to be subsequently formed or the insulator layer 16. The dopant concentration in the doped regions of the handle substrate 12 can be optimized for device performance. The thickness of the handle substrate 12 can be from 50 microns to 1 mm, although lesser and greater thicknesses can also be employed.

The insulator layer 16 of the SOI substrate may be a crystalline or non-crystalline oxide or nitride. In one embodiment of the present disclosure, the insulator layer 16 is an oxide such as, for example, silicon oxide. In another embodiment, the insulator layer 16 is a nitride such as, for example, boron nitride. In some embodiments in which boron nitride is used as the insulator layer 16, the boron nitride insulator layer 16 has a lower boron content than the cap layer 18 to be subsequently formed. In other embodiments in which boron nitride is used as the insulator layer 16, the boron nitride insulator layer 16 is non-doped. The thickness of the insulator layer 16 can be from 1 nm to 200 nm, with a thickness from 100 nm to 150 nm being more typical.

Figure 2:
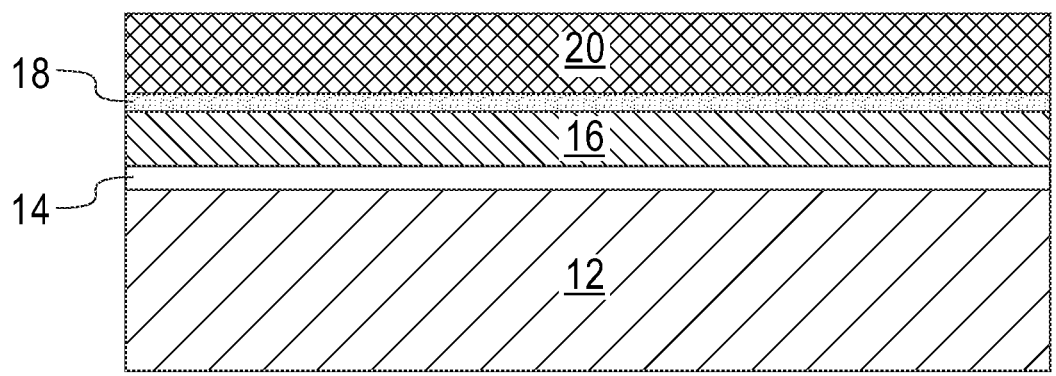
FIG. 2 is a pictorial representation (through a cross sectional view) depicting another SOI structure in accordance with another embodiment of the present disclosure.

When the insulator layer 16 is composed of boron nitride, a layer of insulating oxide 14 may be optionally employed. As shown in FIG. 2, the layer of insulating oxide 14 is present atop of the handle substrate 12. The optional layer of insulating oxide 14 includes an oxide of a semiconductor which may or may not be the same as the semiconductor material of the underlying handle substrate 12. Typically, but not necessarily always, the optional layer of insulating oxide 14 is an oxide of the underlying semiconductor material. Examples of insulating oxides that can be employed as the layer of insulating oxide 14 include, but are not limited to, silicon oxide, silicon germanium oxide, and an oxide of a silicon carbon alloy. In one embodiment of the present disclosure, the optional layer of insulating oxide 14 is silicon oxide. The optional layer of insulating oxide 14 can be formed utilizing a conventional deposition process such as, for example, thermal oxidation of the handle substrate, chemical vapor deposition (CVD), plasma enhanced chemical vapor deposition (PECVD), evaporation or chemical solution deposition. In some embodiments, the optional layer of insulating oxide 14 is a thermal insulating oxide that is formed utilizing a thermal oxidation process.

When present, the thickness of the optional layer of insulating oxide 14 is less than the thickness of a conventional buried oxide of a conventional SOI structure. In one embodiment of the present disclosure, the optional layer of insulating oxide 14 has a thickness from 5 nm to 10 nm. In another embodiment, the optional layer of insulating oxide 14 has a thickness from 2 nm to 5 nm. The presence of the optional layer of insulating oxide 14 serves to provide a good adhesion interface between the handle substrate 12 and the insulator layer 16 when the insulator layer 16 is composed of boron nitride and to plug any pin holes in as well as to absorb volatile species coming from the deposited boron nitride.

The cap layer 18 in the present disclosure functions as an electrically leaky layer that is capable to dissipate positive charges trapped in the insulator layer 16. In some embodiments of the present application, the cap layer 18 can comprise a boron-rich compound. In other embodiments of the present application, the cap layer 18 can comprise doped boron nitride.

In some embodiments of the present disclosure, the cap layer 18 is comprised of a boron-rich compound such as, for example, boron-rich boron nitride (BN), boron-rich silicon boron nitride (SiBN), boron-rich carbon boron nitride (CBN), boron-rich boron silicon (BSi) or boron-rich boron silicon oxide (BSiO).

The cap layer 18 of boron-rich compound can be formed by a conventional process, such as, for example chemical vapor deposition (CVD), plasma enhanced chemical vapor deposition (PECVD), atomic layer deposition (ALD), plasma enhanced atomic layer deposition (PEALD) or physical vapor deposition (PVD). During the deposition process, a boron-containing precursor is introduced into the processing chamber. The boron-containing precursor may be diborane ($B_2H_6$), borazine ($B_3N_3H_6$), or an alkyl-substituted derivative of borazine. By varying the flow rates of the boron-containing precursor, the concentration of boron in the cap layer 18 can be controlled. The boron-rich compound produced can be stoichiometric or non-stoichiometric as long as the cap layer 18 that is formed contains an excess amount of boron. In one embodiment of the present disclosure, the cap layer 18 is composed of boron-rich boron nitride formed by reacting a diborane gas with ammonia ($NH_3$). In another embodiment, the cap layer 18 is composed of boron-rich boron silicon nitride formed by reacting silane ($SiH_4$) with $NH_3$ atmosphere in the presence of a diborane gas. The cap layer 18 of boron-rich compound can be formed with boron uniformly distributed throughout. Alternatively, the cap layer 18 of boron-rich compound can be formed with a graded boron concentration, in which the boron concentration is the highest at the interface between the insulator layer 16 and the cap layer 18.

In other embodiments of the present disclosure and as mentioned above, the cap layer 18 can comprise doped boron nitride. Examples of dopants that can be employed in providing a doped boron nitride layer include, but are not limited to, tungsten, tantalum, cobalt, molybdenum, and titanium. The dopants can be introduced by in-situ doping, ion implantation, gas phase doping, out-diffusion from a sacrificial dopant source material or other means known in the art. In one embodiment, dopants in the cap layer 18 of doped boron nitride may be uniformly distributed throughout with a dopant concentration of $1 \times 10^{18}$ atoms/cm$^3$ or higher. Typically, the dopant concentration in a cap layer 18 of doped boron nitride is from $1 \times 10^{19}$ atoms/cm$^3$ to $5 \times 10^{20}$ atoms/cm$^3$. Alternatively, a graded dopant profile may be utilized with the highest dopant concentration being at the interface between the insulator layer 16 and the cap layer 18.

The thickness of the cap layer 18 can be from 1 Å to 1000 Å, although greater thicknesses can also be employed.

The SOI layer 20 comprises a second semiconductor material including, for example Si, SiC, SiGe, SiGeC, Ge alloys, GaAs, InAs, InP as well as other III-V or II-VI compound semiconductors. In one embodiment, the second semiconductor material of the SOI layer 20 may be comprised of a same semiconductor material as that of the handle substrate 12. In another embodiment, the second semiconductor material of the SOI layer 20 may be comprised of a different semiconductor material as that of the handle substrate 12.

The SOI layer 20 may be doped, undoped or contain doped and undoped regions therein. For clarity, the doped regions are not specifically shown in the drawings of the present disclosure. Each doped region within the SOI layer 20 may have the same, or they may have different conductivities and/or doping concentrations. The doped regions that are present in the SOI layer 20 can be formed by ion implantation process or gas phase doping. The dopant concentration in doped regions of the semiconductor material layer 20 can be optimized for device performance.

The thickness of the SOI layer 20 can be from 5 nm to 35 nm, although lesser and greater thicknesses can also be employed.

Figure 3:
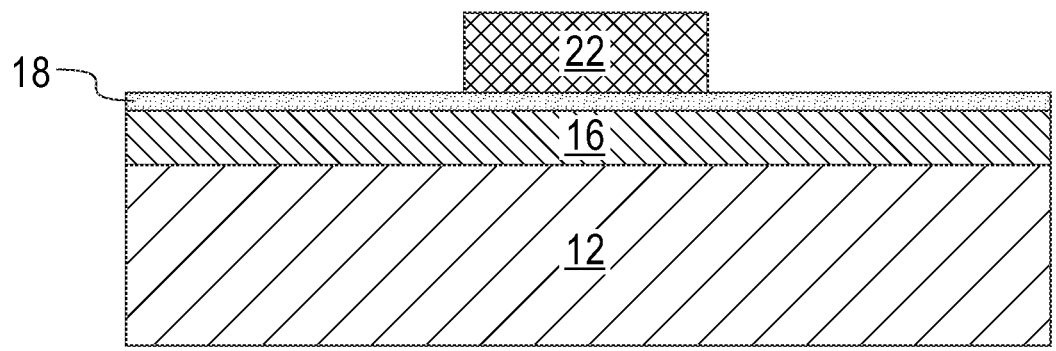
FIG. 3 is a pictorial representation (through a cross sectional view) depicting an SOI structure of the present disclosure including at least one semiconductor mesa in accordance with an embodiment of the present disclosure.
Figure 4:
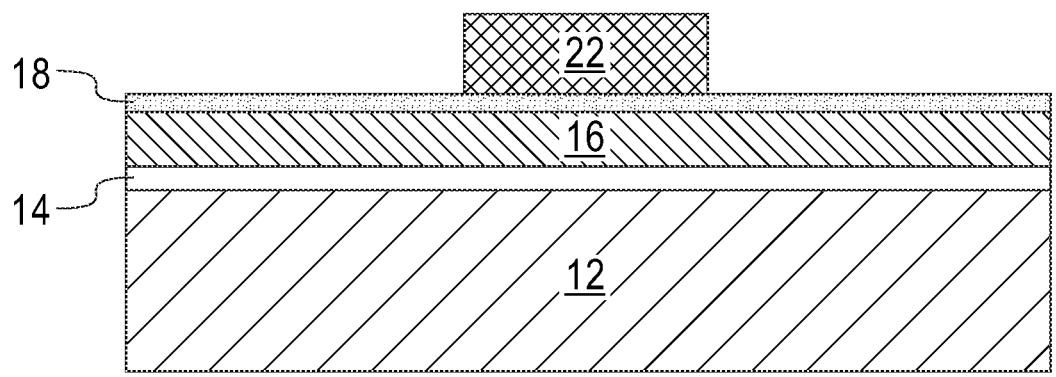
FIG. 4 is a pictorial representation (through a cross sectional view) depicting another SOI structure of the present disclosure including at least one semiconductor mesa in accordance with an embodiment of the present disclosure.

The SOI layer 20 can be a contiguous layer that spans across the entirety of the SOI structure as shown in FIGS. 1 and 2, or a SOI mesa 22 as shown in FIGS. 3 and 4. The SOI mesa 22 is a semiconductor island that has vertical sidewall edges that do not extend beyond, and are not vertically aligned to, vertical sidewall edges of the cap layer 18. The SOI mesa 22 may include a single mesa structure, or a plurality of mesa structures can be located atop the cap layer 18. The width of each SOI mesa 22 may vary depending on the conditions of the lithographic process used to pattern the same and the type of resultant device being fabricating therefrom. In one embodiment, the width of the SOI mesa 22, as measured from one vertical sidewall edge to another vertical sidewall edge, is from 5 nm to 100 nm.

The SOI mesa 22 can be formed by removal of selective portions of SOI layer 20. The removing of selective portions of the semiconductor layer 20 can be performed by lithography and etching. The lithographic step includes forming a photoresist atop the SOI layer 20, exposing the photoresist to a pattern of irradiation, and developing the exposed photoresist utilizing a conventional resist developer. The etching step includes a wet chemical etch process, a dry etch (e.g., reactive ion etching, plasma etching, ion beam etching or laser ablation) process or any combination thereof.

The SOI structures shown in FIGS. 1-4 can be used in forming various semiconductor devices including, but not limited to, FETs, FinFETs, and nanowire FETs. The various semiconductor devices can abut the SOI layer or the at least one SOI mesa. In some embodiments, the semiconductor device is located in, and upon, the SOI layer. In other embodiments, the semiconductor devices are located in and upon exposed surfaces (sidewall and optionally uppermost surfaces) of each SOI mesa. The various semiconductor devices that can be formed include materials that are well known to those skilled in the art and such semiconductor devices can be formed utilizing processing techniques that are well known to those skilled in the art. Detailed concerning the materials of the semiconductor devices and the methods used in forming the same are not provided herein so as not to obscure the various embodiments of the present disclosure.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor-on-insulator (SOI) structure comprising:
    a handle substrate comprising a first semiconductor material;
    an insulator layer located atop an uppermost surface of the handle substrate;
    a cap layer comprising a doped boron nitride located atop the insulator layer, wherein dopants in the doped boron nitride comprise tungsten, tantalum, cobalt, molybdenum, or titanium, and said dopants are present in a dopant concentration greater than $1 \times 10^{18}$ atoms/cm$^3$; and
    an SOI layer comprising a second semiconductor material and located atop the cap layer.

2. The SOI structure of claim 1, wherein the dopants in the doped boron nitride are uniformly distributed throughout the cap layer.

3. The SOI structure of claim 1, wherein the dopants in the doped boron nitride have a gradient distribution with an amount of dopants being greater at an interface between the cap layer and the insulator layer.

4. The SOI structure of claim 1, wherein the insulator layer comprises silicon oxide or boron nitride.

5. The SOI structure of claim 4, further comprising a layer of insulating oxide located between the handle substrate and the insulator layer when the insulator layer is composed of boron nitride.

6. The SOI structure of claim 5, wherein the layer of insulating oxide comprises silicon oxide, silicon germanium oxide, or an oxide of a silicon carbon alloy.

7. The SOI structure of claim 1, wherein the first semiconductor material and the second semiconductor material are comprised of a same semiconductor material and are selected from the group consisting of silicon, germanium, silicon-germanium alloy, silicon carbon alloy, silicon-germanium-carbon alloy, III-V compound semiconductor materials, II-VI compound semiconductor materials, and organic semiconductor materials.

8. The SOI structure of claim 1, wherein the first semiconductor material and the second semiconductor material are comprised of different semiconductor materials and said first semiconductor material and said second semiconductor material are selected from the group consisting of silicon, germanium, silicon-germanium alloy, silicon carbon alloy, silicon-germanium-carbon alloy, III-V compound semiconductor materials, II-VI compound semiconductor materials, and organic semiconductor materials.

9. The SOI structure of claim 1, further comprising at least one semiconductor device abutting the SOI layer.

10. A semiconductor-on-insulator (SOI) structure comprising:
    a handle substrate comprising a first semiconductor material;
    an insulator layer located atop an uppermost surface of the handle substrate;
    a cap layer comprising a doped boron nitride located atop the insulator layer, wherein dopants in the doped boron nitride comprise tungsten, tantalum, cobalt, molybdenum, or titanium, and said dopants are present in a dopant concentration greater than $1 \times 10^{18}$ atoms/cm$^3$; and
    at least one SOI mesa comprising a second semiconductor material and located atop the cap layer, said at least one SOI mesa having vertical sidewall edges that do not extend beyond, and are not vertically aligned to, vertical sidewall edges of the cap layer.

11. The SOI structure of claim 10, wherein the insulator layer comprises silicon oxide or boron nitride.

12. The SOI structure of claim 11, further comprising a layer of insulating oxide located between the handle substrate and the insulator layer when the insulator layer is composed of boron nitride.

* * * * *